(12) United States Patent
Tan et al.

(10) Patent No.: US 7,190,074 B2
(45) Date of Patent: Mar. 13, 2007

(54) RECONSTRUCTED SEMICONDUCTOR WAFERS INCLUDING ALIGNMENT DROPLETS CONTACTING ALIGNMENT VIAS

(75) Inventors: Yong Kian Tan, Singapore (SG); Wuu Yean Tay, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/196,584

(22) Filed: Aug. 2, 2005

(65) Prior Publication Data

US 2005/0275116 A1    Dec. 15, 2005

Related U.S. Application Data

(62) Division of application No. 10/645,389, filed on Aug. 21, 2003, now Pat. No. 7,071,012.

(30) Foreign Application Priority Data

May 7, 2003    (SG)  ................................ 200302784

(51) Int. Cl.
  *H01L 23/24*    (2006.01)
  *H01L 23/48*    (2006.01)
  *H01L 23/52*    (2006.01)
  *H01L 29/40*    (2006.01)
(52) U.S. Cl. ...................... 257/738; 257/774; 257/790
(58) Field of Classification Search ................ 257/738, 257/774, 790
  See application file for complete search history.

(56) References Cited

U.S. PATENT DOCUMENTS

| 4,499,655 A | 2/1985 | Anthony |
| 5,634,267 A | 6/1997 | Farnworth et al. |
| 5,637,536 A | 6/1997 | Val |
| 6,013,534 A | 1/2000 | Mountain |
| 6,053,395 A | 4/2000 | Sasaki |
| 6,064,221 A | 5/2000 | Moden et al. |
| 6,219,908 B1 | 4/2001 | Farnworth et al. |
| 6,245,595 B1 | 6/2001 | Nguyen et al. |
| 6,258,609 B1 | 7/2001 | Farnworth et al. |
| 6,275,051 B1 | 8/2001 | Bachelder et al. |
| 6,444,576 B1* | 9/2002 | Kong .......................... 438/667 |
| 6,610,560 B2 | 8/2003 | Pu et al. |
| 2002/0066523 A1 | 6/2002 | Sundstrom et al. |
| 2003/0164555 A1 | 9/2003 | Tong et al. |

* cited by examiner

*Primary Examiner*—William M. Brewster
(74) *Attorney, Agent, or Firm*—TraskBritt

(57) ABSTRACT

Apparatus, systems and methods relating to the reconstruction of semiconductor wafers for wafer-level processing are disclosed. Selected semiconductor dice having alignment cavities formed in a surface thereof are placed in contact with liquid, gel or other flowable alignment droplets in a similar pattern protruding from a substrate to position the dice through surface tension interaction. The alignment droplets are then solidified to maintain the positioning and an underfill is disposed between the dice and the fixture to strengthen and maintain the reconstructed wafer. A fixture plate may be used in combination with the underfill to add additional strength and simplify handling. The reconstructed wafer may be subjected to wafer-level processing, wafer-level testing and burn-in being particularly facilitated using the reconstructed wafer. Alignment droplets composed of sacrificial material may be removed from the reconstructed wafer and the resulting void filled to form interconnects or contacts on the resulting dice.

6 Claims, 10 Drawing Sheets

RECONSTRUCTED SEMICONDUCTOR WAFERS INCLUDING ALIGNMENT DROPLETS CONTACTING ALIGNMENT VIAS

CROSS-REFERENCE TO RELATED APPLICATIONS

This application is a divisional of application Ser. No. 10/645,389, filed Aug. 21, 2003, now U.S. Pat. No. 7,071,012, issued Jul. 4, 2006, which application claims foreign priority benefit to Singapore patent application Serial No. 200302784-4, filed Jul. 5, 2003.

BACKGROUND OF THE INVENTION

FIELD OF THE INVENTION

The present invention relates to the processing of semiconductor wafers and dice. More particularly, but not necessarily limited thereto, it relates to reconstructing semiconductor wafers using only semiconductor dice that are not known to contain defects to retain the benefits of wafer-level processing while reducing resources spent on processing defective dice.

The advent of wafer-level processing has allowed for substantial savings and efficiency in the creation of microprocessors, as has been widely recognized throughout the industry. Unfortunately, however, almost all wafers contain some bad die sites where defective dice are created. Time and materials are thus wasted on fabricating defective dice.

Attempts have been made to reduce the amount of expensive materials or processing time that is wasted on die sites that are known to be defective on a wafer. One such approach is to track the defective dice on each wafer. As the wafer is processed, initial probe testing of the die sites is conducted as is appropriate. Die sites that are known to be defective are tracked by the processing equipment and, where possible, are omitted from subsequent processing steps. As the dice are singulated, the defective sites, although singulated, are not separated or "picked" from the wafer. While this approach allows for some savings, it cannot eliminate the use of certain resources on the defective die sites, such as equipment for wafer-level testing and burn-in, which is not susceptible, due to its configuration, for contacting only known good dice, or KGD. It would also require processing equipment that is configured and designed to track each die site on each wafer and then apply treatments and testing only to selected sites, which, in most instances, is not feasible. Other approaches involve singulation of the wafer at an early stage, followed by testing and treatment of dice individually, or attempts to repair defects on dice. Such approaches can be costly in both the amount of handling, processing, and materials and in the additional processing time required.

A system or process that allows for the creation of a wafer that lacks any known defective die sites yet maintains the benefits of wafer-level processing would be advantageous. Such a process or method that could be used to form interconnect structures or add other functionality to a die would be further advantageous.

BRIEF SUMMARY OF THE INVENTION

The present invention provides apparatus, systems and methods relating to the reconstruction of semiconductor wafers for wafer-level processing. Selected semiconductor dice having alignment cavities formed in a surface, such as the lower surface, thereof are placed in contact with alignment droplets of a material in a liquid, gel or other flowable state, which position the dice through surface tension interaction. Selected dice may be dice without known defects qualified during probe testing or dice recovered from damaged wafers. The alignment droplets may be disposed in a pattern corresponding to that of the alignment cavities on a reconstruction table, or on a fixture plate. The alignment droplets are solidified to maintain the die positioning and an underfill is disposed about the solidified alignment droplets to strengthen and maintain the reconstructed wafer. Where present, the fixture plate may add additional strength and simplify processing steps by providing structure for enhanced handling of the reconstructed wafer. The reconstructed wafer may undergo any desired wafer-level processing although the present invention is especially suitable for enhancing the utility of wafer-level testing and burn-in equipment used to qualify dice as "known good dice" or KGD. Where the alignment droplets are composed of sacrificial material, or the alignment cavities contain sacrificial material, this material may be removed from the reconstructed wafer. The resulting voids can be filled to form interconnects on the resulting dice. Where the voids are filled with conductive material, contact pads, connections or bumps may be formed.

BRIEF DESCRIPTION OF THE SEVERAL VIEWS OF THE DRAWINGS

In the drawings, which depict the best mode presently known for carrying out the invention.

DETAILED DESCRIPTION OF THE INVENTION

Figure 1:
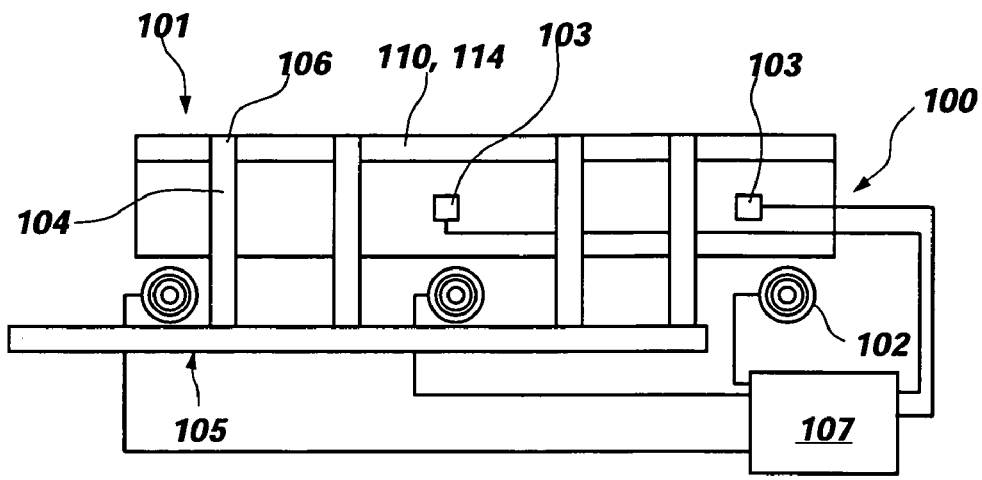
FIG. 1 is a side view of an alternative embodiment of a reconstruction table and fixture plate, useful with some embodiments in accordance with the present invention.

Turning to FIG. 1, there is depicted a reconstruction table 100. Reconstruction table 100 may be used as a platform for reconstructing a semiconductor wafer. One or more wafer reconstruction locations 101 may be present on the reconstruction table 100. In other words, a reconstruction table 100 may be configured for concurrent reconstruction of multiple wafers. A temperature control system 102, schematically represented by coils, may be present in connection with reconstruction table 100 and used to raise, lower, or maintain a desired temperature of the reconstruction table 100 and surrounding environment. In practice, temperature control system 102 may comprise resistive heating elements, passageways within reconstruction table 100 for circulating fluid of heating or cooling, semiconductor-type heat exchange modules, or other heat exchange systems known in the art. Further, one or more sensors 103 may be placed within reconstruction table 100 or in contact therewith, sensors 103 being used with a controller 107 for modulating the temperature of reconstruction table 100 in each region or portions thereof.

At each reconstruction location 101, a plurality of patterns of alignment vias 104 open out at the top surface of a substrate 114 comprising reconstruction table 100, each in communication with an alignment material delivery system 105. Substrate 114 may include a fixture plate 110 disposed on the reconstruction table 100. Fixture plate 110 has a plurality of patterns of vias 106 that align with the alignment vias 104 when placed on a reconstruction location 101 on reconstruction table 100. Fixture plate 110 may be formed of any suitable material, including polymeric materials, crystalline silicon, glass, steel, aluminum or any other suitable material known to those of ordinary skill in the art and desirable for the processing involved. For example, where subsequent processing steps require the lower surface of a wafer to be silicon, a silicon fixture plate 110 may be selected. Alternative embodiments of the process may occur without the use of a fixture plate 110. For example, a resulting wafer lacking a fixture plate 110 may be removed from the reconstruction table 100 following underfill, the discussion of which follows below. To facilitate such a procedure, the reconstruction location 101 may be coated with a compound to aid in the release of a completed wafer therefrom.

Figure 2:
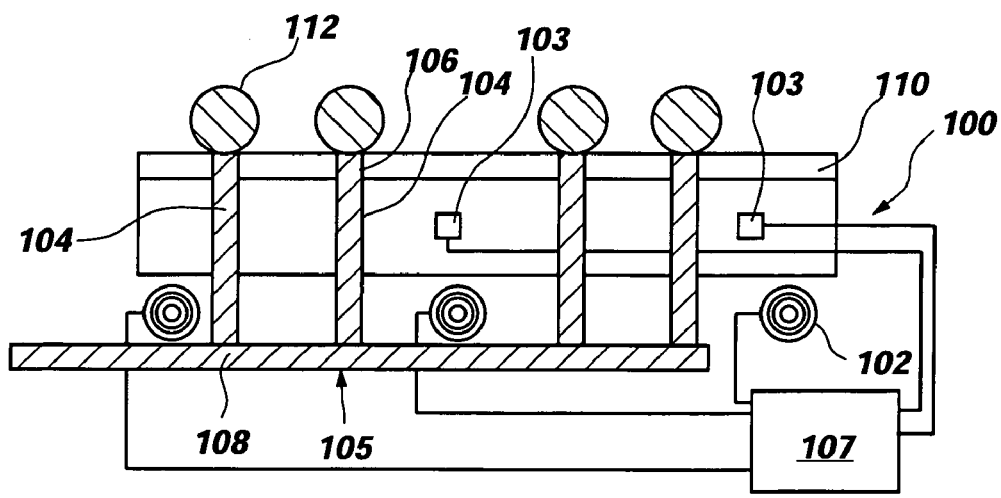
FIG. 2 is a side view of the reconstruction table and fixture plate of FIG. 1 with alignment droplets disposed thereon.

As shown in FIG. 2, using an alignment material delivery system 105, an alignment material 108 is delivered in a liquid, gel or other flowable state through at least one alignment via 104 and corresponding via 106 of fixture plate 110 when present, to form at least one alignment droplet 112 at the reconstruction location 101, atop the fixture plate 110 when present. Preferably, a number of alignment droplets 112 will be formed into a desired pattern by the arrangement of a number of alignment vias 104, as will be explained in more detail further herein.

Figure 3:
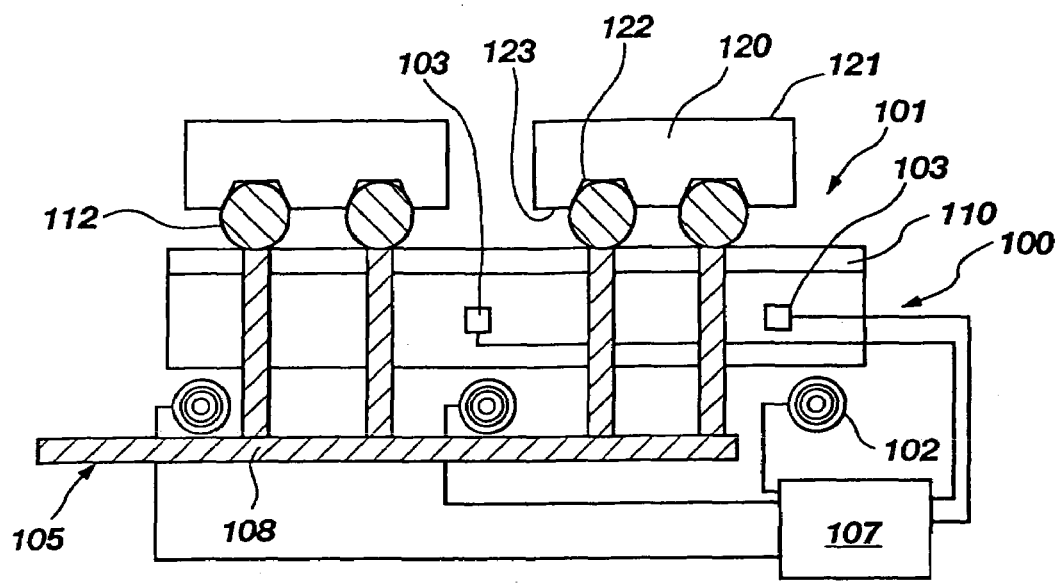
FIG. 3 is a side view of a reconstruction table in accordance with the present invention, with semiconductor dice disposed thereon, arranged in suitable positions by the alignment droplets.

Turning to FIG. 3, a plurality of semiconductor dice 120 are shown disposed at the reconstruction location 101. Dice 120 may be selected by qualification using wafer probe testing, visual inspection of dice sites on a wafer, or as otherwise desired and known to those of ordinary skill in the art. Each die 120 may be formed of silicon, gallium arsenide, indium phosphide or other suitable semiconductor material and includes at least one alignment cavity 122 and preferably a pattern thereof, located on a lower surface 123. For purposes of facilitating the understanding of the invention, the die 120 will be referred to as having an active surface 121 as the upper surface of the die with an opposite lower non-active surface 123. It will be understood that such terms are for making relative positions clear and do not limit the invention. Alignment cavities 122 may be formed in the lower non-active surface 123 of each die 120 using any suitable method for forming vias, cavities, or trenches in semiconductor substrates known to those of ordinary skill in the art. For example, the alignment cavities 122 may be formed by wet etching, dry etching (and comprise either isotropic etching or anisotropic etching), laser ablation, drilling or boring with a mechanical drill bit, or otherwise as known to those of ordinary skill in the art. Although embodiments utilizing a single alignment cavity 122 may be designed and are within the scope of the present invention, it is currently preferred to use a plurality of patterns of alignment cavities 122 on the lower non-active surface 123, in order to allow the die 120 to be correctly positioned in multiple directions, being the X and Y directions parallel to the plane of reconstruction table 100, as well as rotationally in the same plane. For example, one or more parallel rows of alignment cavities 122 or a pattern of alignment cavities 122 (for example, patterns of four cavities in each die 120 to be aligned) may be formed on the lower surface of each die. It will be appreciated that any desirable or advantageous arrangement of the alignment cavities 122 on the lower non-active surface 123 of the die 120 may be used and all such patterns and arrangements are within the scope of the present invention.

Each alignment cavity 122 may be formed to any desired depth in the die 120, so long as it is sufficient to enable the alignment of the die 120 when interacting with a corresponding alignment droplet 112, as will be explained further herein. For some embodiments, one or more alignment cavities 122 may be used as vias connecting the active surface 121 of the die 120 to the lower non-active surface 123, increasing throughput by using a single structure for multiple purposes, and enabling novel methods of forming die 120 interconnects or bumped dice for flip-chip applications. Such embodiments will be discussed in more detail further herein.

As a die 120 is placed into the reconstruction location 101 by, for example, conventional and suitably programmed pick-and-place equipment, it is roughly aligned with a desired final position in the resulting reconstructed wafer. The alignment droplet(s) 112 thus make contact with one or more alignment cavities 122 on the lower non-active surface 123 of the die 120. The die 120 is then released and the surface tension of the alignment droplets 112 interacts with the similarly patterned alignment cavities 122 to position the die 120 in its final, precise alignment and hold the die 120 in the correct, desired position. By positioning patterns of alignment droplets 112 in the reconstruction location 101 to define locations of dice 120 for reconstruction of a wafer, a plurality of dice 120 may be aligned in proper positions with respect to one another to form a reconstructed wafer for further wafer-level processing. Achieving and maintaining proper positioning among the dice is important and required to allow processing of the reconstructed wafer to take place with conventional equipment.

Once a desired number of dice 120 are correctly aligned in the proper positions, the alignment droplets 112 are then at least partially solidified to retain the dice 120 in the correct positions. For example, by using the temperature control system 102, the temperature of the reconstruction table 100 may be raised or lowered to effect an at least partial solidification of a liquid alignment material 108 comprising alignment droplets 112, solidifying the liquid alignment material 108 and adhering the solidified alignment droplets 112 to the dice 120. In an alternative example, when using a thermoplastic resin such as the alignment material 108, the thermoplastic resin may be heated to a melting point by using temperature control system 102 and delivered through alignment vias 104 to form alignment droplets 112. The temperature of the thermoplastic resin may then be cooled or allowed to cool to a point where the alignment material 108 at least partially solidifies. As another example, a thermoset resin may be used as the alignment material 108, pumped through the alignment vias 104 to form alignment droplets 112 and then heated using temperature control system 102 to solidify. A third exemplary alignment material 108 may be a liquid epoxy that is heat cured to solidify. With such embodiments, where necessary, the temperature of the alignment vias 104 may be separately maintained at a lower level to prevent solidification therein. An additional example of a suitable alignment material 108 may be a low melting point metal, such as a tin/lead solder, silver solder or other low melting point metals or alloys. The low melting point metal may be melted and delivered through alignment vias 104 to form alignment droplets 112 and then cooled, or allowed to cool, to solidify. It will, of course, be appreciated that alternative processes for solidifying alignment droplets 112 may be used and are within the scope of the present invention, such as the application of a chemical setting agent, the exposure of alignment droplets 112 formed of a photoreactive alignment material 108 to an appropriate wavelength of light, such as a photopolymer that is cured by exposure to radiation (as, for example, polymers that are liquid when heated and gel upon exposure to radiation, such as UV light, x-rays, microwaves, etc.), or any other process known to those of ordinary skill in the art.

Figure 4:
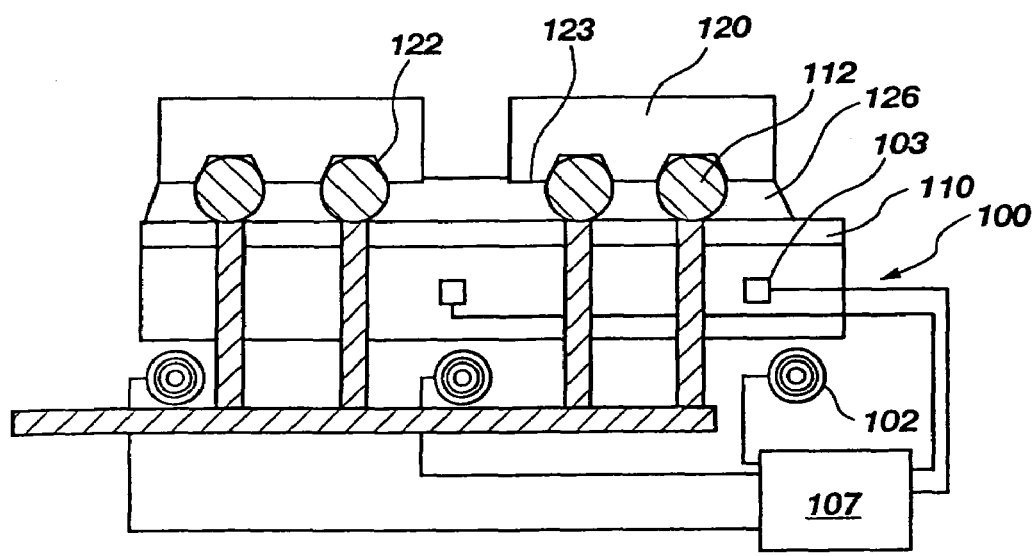
FIG. 4 is a side view of the reconstruction table of FIG. 3, with an underfill disposed between the semiconductor dice and the fixture plate.
Figure 5:
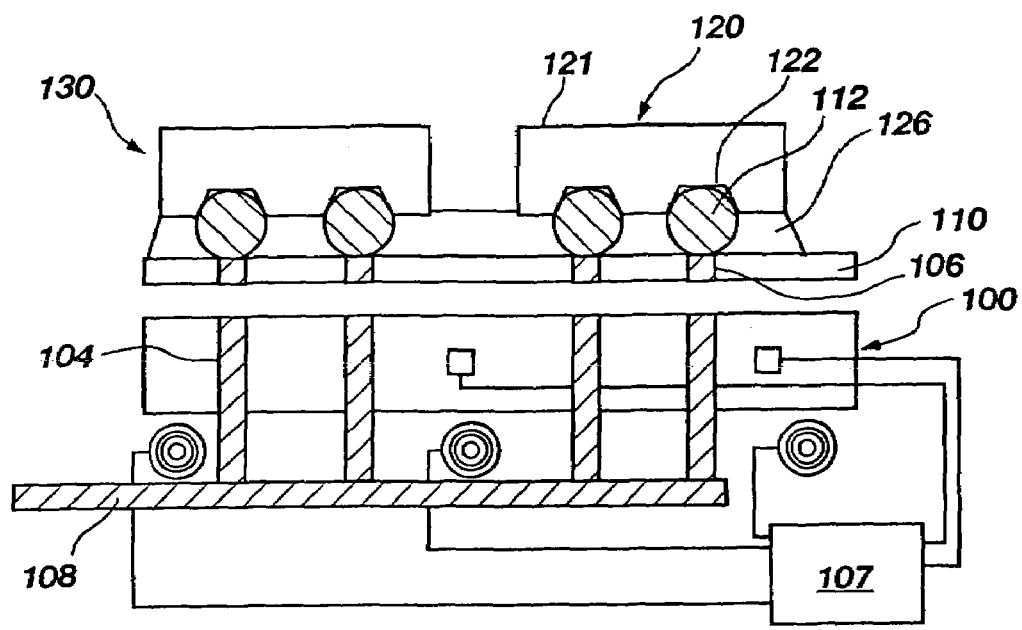
FIG. 5 is a side view showing one embodiment of a reconstructed wafer, in accordance with the present invention, separated from the reconstruction table.

Once alignment droplets 112 are at least partially solidified, an underfill material 126, such as an epoxy, may be disposed under the dice 120. The embodiment of FIG. 3, with an underfill material 126 disposed between the dice 120 and the fixture plate 110, is shown in FIG. 4. Various dielectric underfill materials 126, such as conventional underfill epoxies, are known to those of ordinary skill in the art and any suitable underfill material may be employed to retain the die 120 to the fixture plate 110 or otherwise solidify the positions of dice 120 in the reconstructed wafer. Once the underfill material 126 has cured, a reconstructed wafer 130 is formed and may be removed with fixture plate 110 (if present) from the reconstruction table 100, as shown in FIG. 5. The reconstructed wafer 130 then may undergo any desired wafer-level processing to complete the fabrication of the dice 120 or for creation of complete multidie semiconductor assemblies. For example, the reconstructed wafer 130 may undergo wafer-level testing and burn-in to qualify dice 120 thereof as KGD, although it will be appreciated that any desired wafer-level treatment such as wafer-level rerouting or wafer-level treatments for packaging may be performed on the reconstructed wafer 130.

It will be appreciated that the term "reconstructed wafer," as used herein, means any reconstructed bulk substrate, including semiconductor dice. Such reconstructed wafers may have any desired shape, including a conventional round wafer shape, which may be desirable for processing with conventional wafer handling and processing equipment. Other embodiments may produce square or rectangular reconstructed wafers, which may be desirable for use with testing equipment. All such shapes are within the scope of the present invention.

Figure 6:
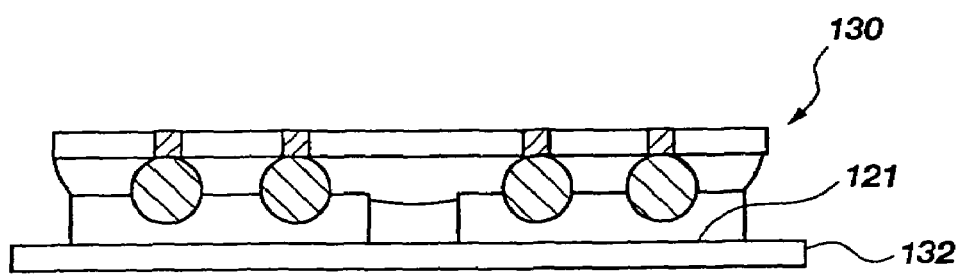
FIG. 6 is a side view depicting the reconstructed wafer embodiment of FIG. 5 attached to an adhesive tape for back-grinding.
Figure 7:
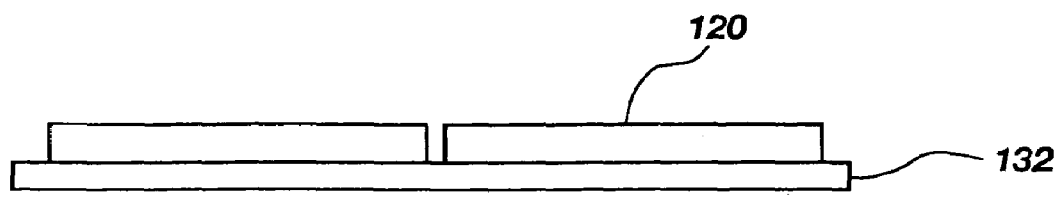
FIG. 7 is a side view depicting the reconstructed wafer of FIGS. 5 and 6 after a back-grinding process.
Figure 8:
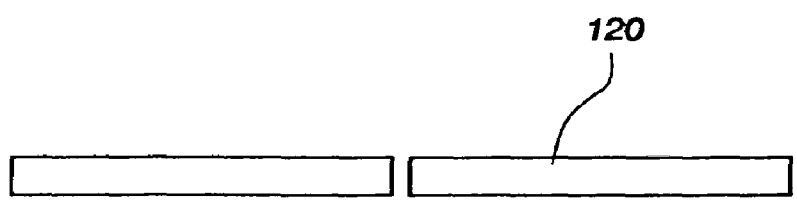
FIG. 8 is a side view of another embodiment of individual semiconductor dice singulated from the reconstructed wafer of FIG. 7.

Once wafer-level processing is complete, the reconstructed wafer 130 may then be singulated into a number of separate dice 120, which may be KGD, as previously noted. One process for singulation is depicted in FIGS. 6, 7 and 8. The reconstructed wafer 130 is attached to a film of adhesive-coated polymer 132, as in a conventional wafer backgrinding process, with the active surface 121 of the dice 120 adhered to the adhesive-coated polymer 132, as depicted in FIG. 6. The reconstructed wafer 130 is then back-ground, removing the fixture plate 110 (when present), the underfill material 126 and the alignment droplets 112. Where the dice 120 are of sufficient depth or thickness, the back-grinding may continue to remove the alignment cavities 122 and the remainder of alignment droplets 112 located therein and any desired portion of the reconstructed wafer 130 thickness, resulting in the structure shown in FIG. 7, of a plurality of thinned dice 120 attached to the adhesive-coated polymer 132. The individual finished dice 120 may then be separated by simply removing the adhesive-coated polymer 132, as depicted in FIG. 8. Of course, it will be appreciated that any alternative method for wafer singulation known to those of ordinary skill in the art may be used to separate the dice 120. For example, the reconstructed wafer may be singulated with a conventional wafer saw or by any other suitable technique.

The foregoing method thus enables creation of a reconstructed wafer using only dice 120 that have no visible defects, or dice 120 that through probe testing have been determined to be at least functional. Additional changes and refinements may be made to the basic method and all such refinements are within the scope of the present invention.

Some embodiments of processes in accordance with the present invention may be used to form interconnects or other structures as a reconstructed wafer is formed or dice 120 are singulated therefrom. Examples of such processes are depicted in FIGS. 9–18, as discussed below.

Figure 9:
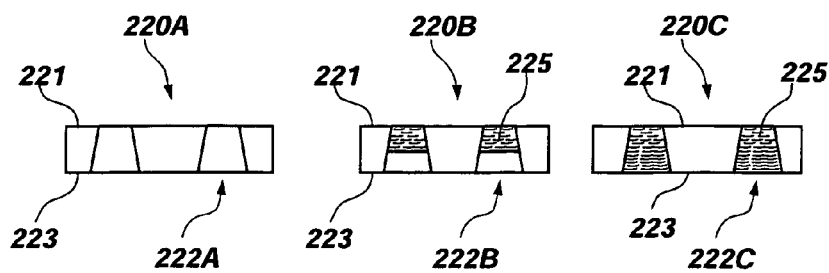
FIG. 9 is a side view of some additional embodiments of semiconductor dice that are useful in some embodiments in accordance with the present invention.

FIG. 9 depicts several different dice 220A, 220B and 220C that may be used in practicing certain embodiments of the present invention. Different alignment vias 222A, 222B, 222C treatments have been applied to each die 220A, 220B and 220C. The alignment vias of die 220A comprise at least one via 222A that passes through the thickness of the entire die, allowing contact between the active surface 221 and the non-active surface 223 therethough. Where desirable, a suitable coating may be placed on the interior surface of the via 222A. For example, an insulative coating may be placed on the via 222A walls to protect the die 220A from the inductive effects of a current passing through conductive material later filling the via 222A. Alternatively, a conductive coating may be applied to form part of a conductive interconnection structure.

The alignment vias 222 of die 220B similarly comprise at least one via 222B that passes through the thickness of the die 220B. Via 222B is partially filled with a selected filler material 225, such as a sacrificial material or a conductive material that can be in electrical communication with the integrated circuit formed on the active surface 221 of the die 220B. Preferably, via 222B is filled from ¼ to ¾ with the selected filler material 225, although any other suitable partial filling may be used. Similarly, the at least one alignment via 222C of die 220C passes through the thickness of the die 220C, but is filled with any suitable selected filler material 225 substantially throughout its depth. It will, of course, be appreciated that the walls of alignment vias 222B and 222C may be coated with any desired coatings prior to filling with the selected filler material 225.

Figure 10:
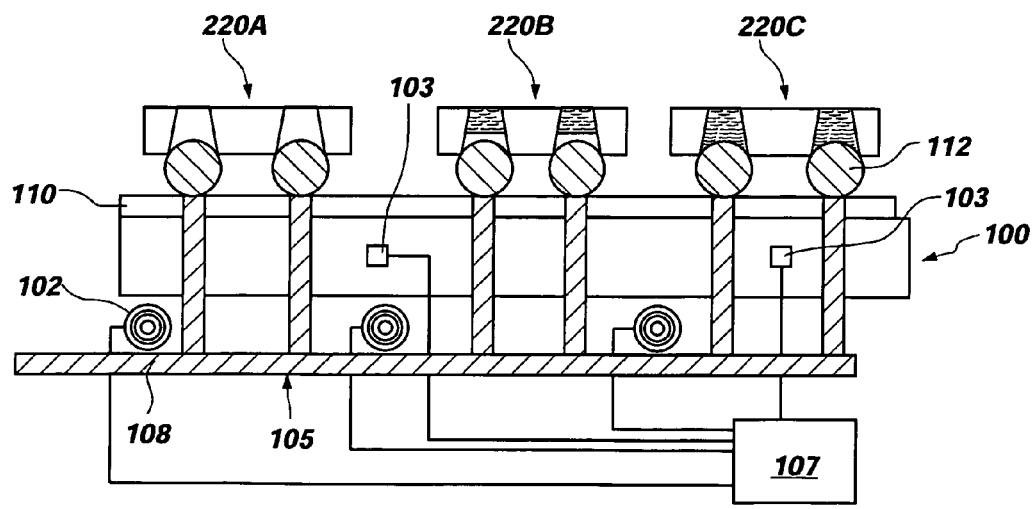
FIG. 10 is a side view of a reconstruction table in accordance with the present invention, with the semiconductor dice of FIG. 9 disposed thereon, arranged in suitable positions by the alignment droplets.

As shown in FIGS. 9 and 10, a number of alignment droplets 112 are extruded through the reconstruction table 100, and the dice 220A, 220B, 220C, are disposed thereon, such that the interaction of the surface tension of the alignment droplets 112 aligns dice 220A, 220B, 220C, for exact placement in a reconstructed wafer, as has been discussed previously herein. It will be appreciated that the alignment droplet 112 size may be controlled to result in filling the volume of the alignment vias 222A–222C that has not been filled previously with a selected filler material with the alignment droplet 112. In the case of an "empty" via, such as 222A, this can result in a via filled with the alignment material 108 or a via partially filled with alignment material 108. For a partially empty via, such as 222B, this results in a via partially filled with selected filler material 225 with the remainder filled by alignment material 108. In the case of a filled alignment via 222C, the material of the alignment material 108 is selected to "wet" the filler material 225, so that the surface tension of alignment droplets 112 is effective to align die 220C. Where desired, the alignment material 108 may be a conductive material, such as a metallic solder, a conductive polymer, or a polymer containing conductive material suspended therein. Alternatively, the alignment material 108 may comprise a sacrificial material. It will be appreciated that the term "sacrificial material," as used herein, refers to any material, or compound, that may be utilized for a specific function in any process or method of the present invention and then be removed at a later stage of such process or method. For example, where the alignment droplets 112 are back-ground from the die 120, as discussed previously herein, such alignment droplets 112 are considered to be a sacrificial material. Sacrificial materials may be selected to facilitate their removal after use, as will be discussed further herein.

Figure 11:
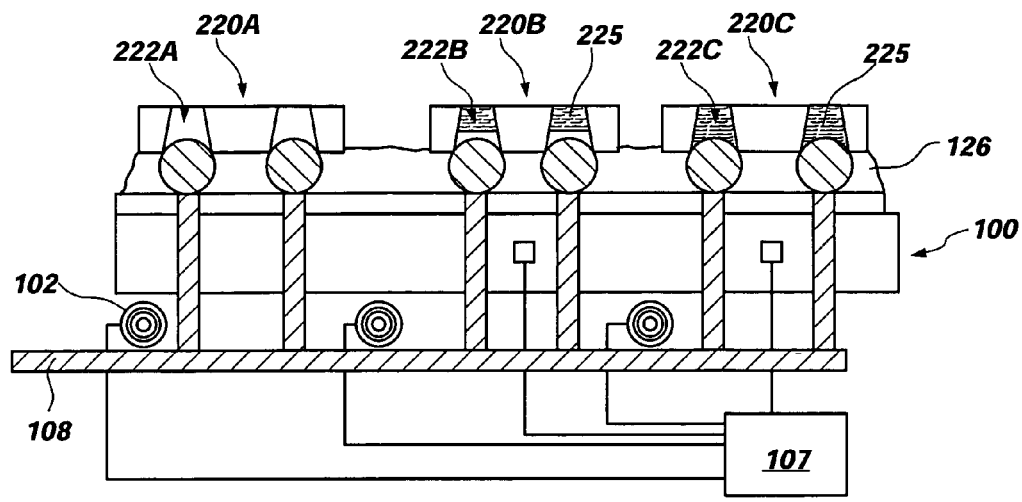
FIG. 11 is a side view of the reconstruction table of FIG. 10, with an underfill disposed between the semiconductor dice and the reconstruction table.
Figure 12:
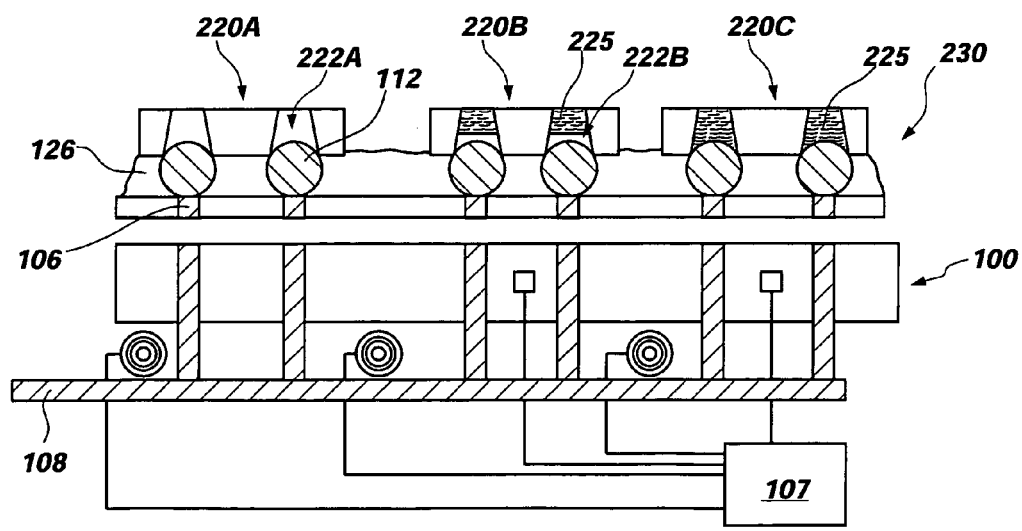
FIG. 12 is a side view showing one embodiment of a reconstructed wafer, in accordance with the present invention, separated from the reconstruction table.
Figure 12A:
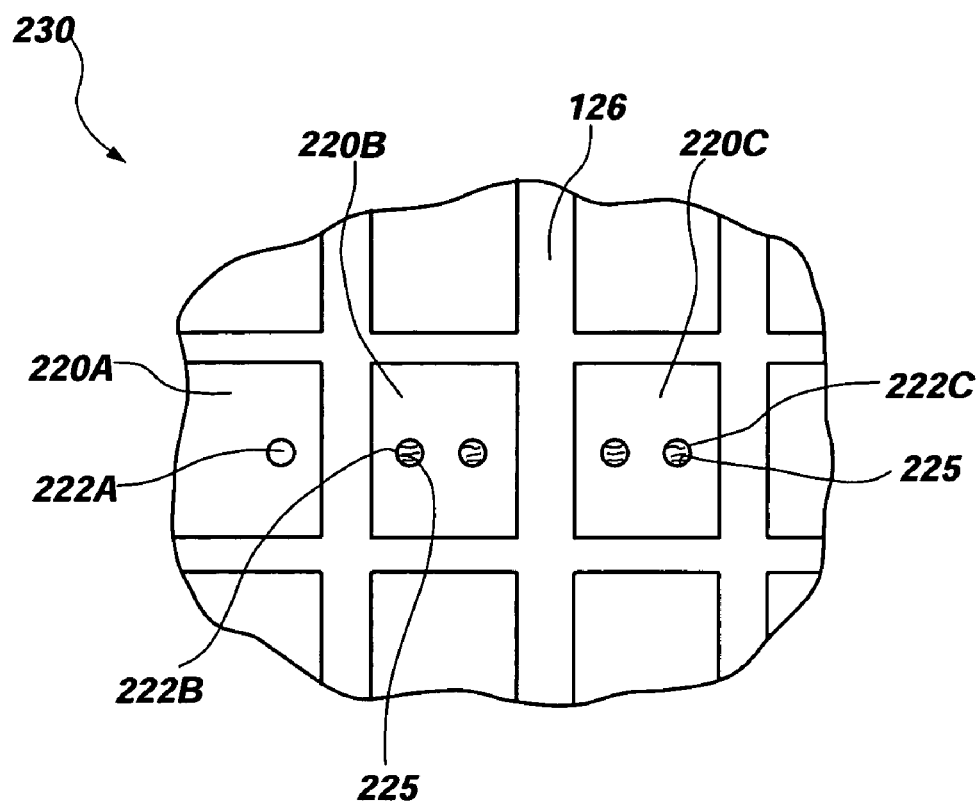
FIG. 12A is a top elevated view of a portion of the reconstructed wafer of FIG. 12.

The alignment droplets 112 are then heated, cooled, or otherwise treated to at least partially solidify and an underfill material 126 is disposed underneath the dice 220A, 220B, 220C, and around the solidified alignment droplets 112, resulting in the structure seen in FIG. 11. Once the underfill 126 has set or otherwise solidified, the reconstructed wafer 230 may then be removed for processing, as discussed previously herein and depicted in FIG. 12. A plan view of a portion of the reconstructed wafer 230 is shown in FIG. 12A.

Referring back to FIG. 12, the reconstructed wafer 230 may undergo any wafer-level processing that is desired as is discussed previously herein. Wafer-level burn-in and testing may even be conducted. Where the alignment material 108 selected is a conductive material and, if present, the selected filler material 225 is also conductive and makes contact with the patterns of the active surface 221 of the die 220A, 220B, 220C, testing and burn-in may be effected by making electrically communicative contact with the solidified alignment material 108 as exposed at the non-active surface 223 of the reconstructed wafer 230, as through the vias 106 of a fixture plate 110.

Figure 13:
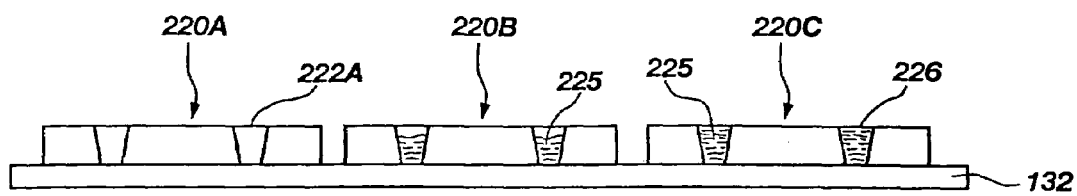
FIG. 13 is a side view depicting the reconstructed wafer of FIG. 12 after a back-grinding process.
Figure 14:
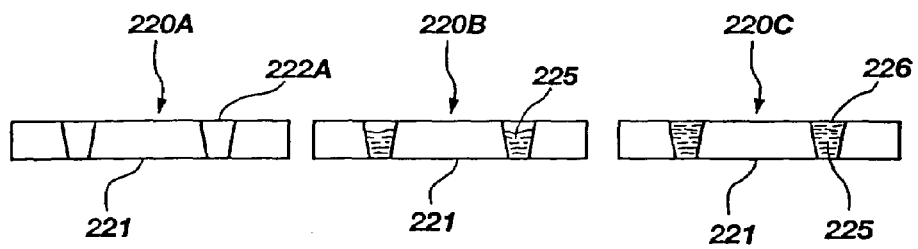
FIG. 14 is a side view of another embodiment of individual semiconductor dice singulated from the reconstructed wafer of FIG. 13.

Following the wafer-level processing, the reconstructed wafer 230 may then be singulated into a plurality of separate dice 220A, 220B, 220C. Similar to that discussed previously herein, one process for doing so is depicted in FIGS. 13 and 14. The reconstructed wafer 230 is attached to a length of adhesive-coated polymer 132, as in a conventional wafer back-grinding process, with the active surfaces 221 of the dice 220A, 220B, 220C, adhered to the adhesive-coated polymer 132. The reconstructed wafer 230 is then back-ground, removing the fixture plate 110 (where present), the underfill material 126 and the alignment material 108 or selected filler material 225 that is present in the portion of the dice 220A, 220B, 220C, that are back-ground. This results in a number of thinned dice 220A, 220B, 220C, attached to the adhesive-coated polymer 132, similar to that depicted in FIG. 7. Each finished die 220A, 220B, 220C, contains a via 222A, 222B, 222C, across the width there of that is filled either with the selected filler material 225 or the alignment material 108. Where the alignment material 108, alone or in combination with a contacting selected filler material 225, is conductive and is in electrical communication with the active surface 221 of the dice 220A, 220B, 220C, this provides contacts 226 on the non-active surfaces 223 of the dice that may be utilized in mounting the dice 220A, 220B, 220C, in a complete semiconductor package or in an appropriate device. Individual finished dice 220A, 220B, 220C, may be separated by simply removing the adhesive-coated polymer 132, as depicted in FIG. 14. Of course, it will be appreciated that any alternative method for wafer singulation, known to those of ordinary skill in the art, may be used to separate the dice 220A, 220B, 220C.

Some additional processing embodiments, in accordance with the principles of the present invention, are depicted in FIGS. 15–18. A reconstructed wafer 230A is created as discussed previously herein in connection with FIGS. 9–12. At this point, the reconstructed wafer may undergo any desired wafer-level processing procedure. Then, if a fixture plate 110 was used in creating the reconstructed wafer 230A, the fixture plate 110 is removed, mechanically by back-grinding, or by utilizing the fixture plate 110 formed from a material that may be dissolved, or by removing the fixture plate 110 with treatment by a suitable release agent. Of course, the need for this procedure may be eliminated by creating the reconstructed wafer 230A that lacks a fixture plate 110.

The alignment droplets 112 are thus at least accessible, if not partially exposed, through the underfill material 126 which holds the reconstructed wafer 230A together. Where the alignment material 108 is comprised of a sacrificial material, the alignment material 108 may then be removed from the reconstructed wafer 230A. Where the selected filler material 225 is a sacrificial material, it may also be removed. Removal of the sacrificial material may be accomplished in any manner suitable for the specific sacrificial material at issue. For example, a selective chemical etch may be performed to remove the sacrificial material. Alternatively, where appropriate, the temperature of the reconstructed wafer 230A may be lowered or raised to reverse the alignment material 108 phase change and allow a sacrificial material that is no longer solid to be removed by application of a vacuum or by a flushing or draining procedure.

Figure 15:
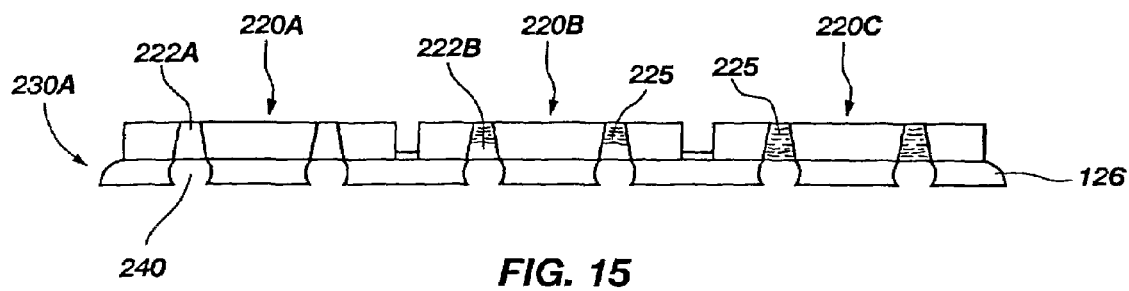
FIG. 15 is a side view depicting the reconstructed wafer of FIG. 12 with a sacrificial material removed therefrom.
Figure 16:
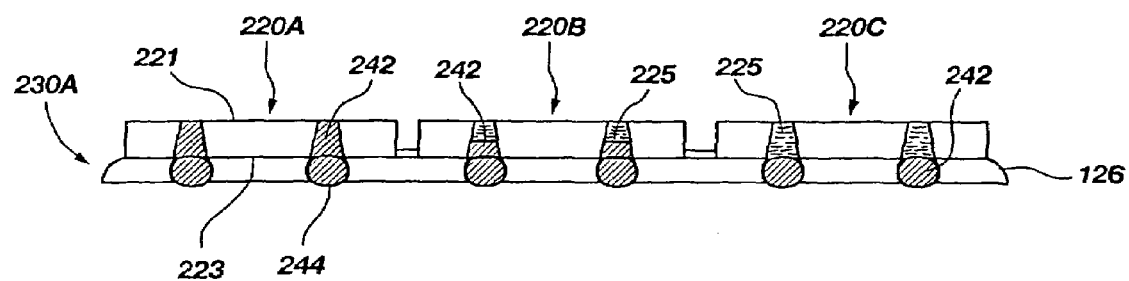
FIG. 16 is a side view depicting the reconstructed wafer of FIG. 15 with a selected replacement filler material filling the void created by the removal of the sacrificial material.

Once the sacrificial material is removed, the reconstructed wafer 230A contains at least one void 240 in the underfill material 126 that corresponds to a removed alignment droplet 112 and may be connected to an empty, or at least partially empty, alignment via, such as those depicted as 222A and 222B in FIG. 15. At this point, the vacated volume may be filled with a selected replacement filler material 242, as is desired. For example, the selected replacement filler material 242 may be a conductive metal or alloy, such as tin/lead solder, gold or a conductive polymer or conductively filled polymer to create a conductive structure through the via 222A, 222B, 222C, and an integral conductive bump 244 on the non-active surface 223, as depicted in FIG. 16. Of course, it will be appreciated that any desired selected replacement filler material 242 may be used.

Figure 17:
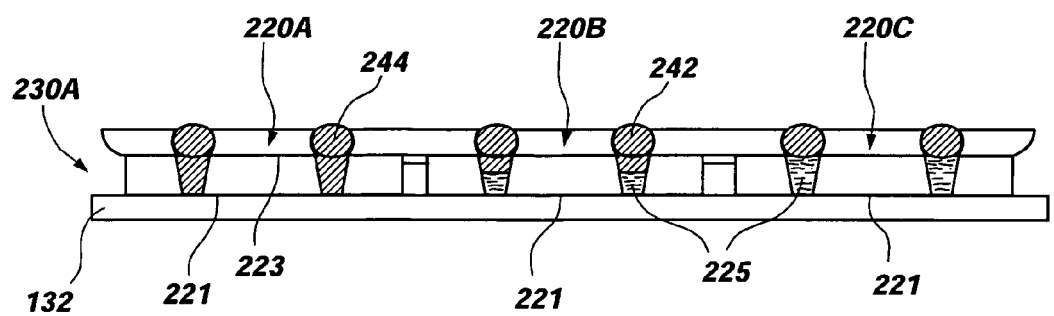
FIG. 17 is a side view depicting the reconstructed wafer embodiment of FIG. 16 attached to an adhesive tape for back-grinding.
Figure 18:
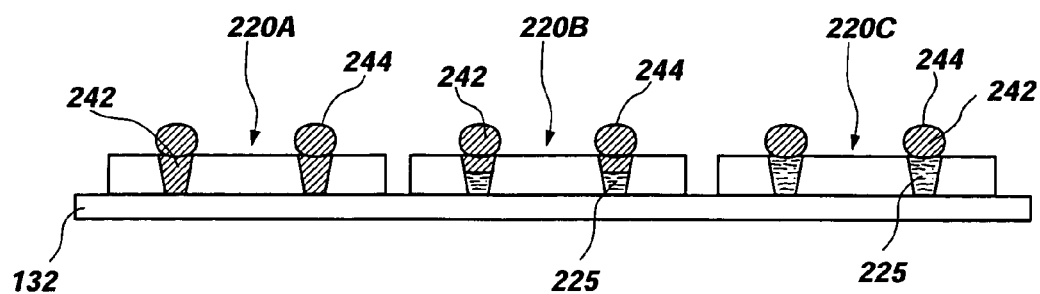
FIG. 18 is a side view depicting the reconstructed wafer of FIG. 17 with an underfill material removed therefrom.

The reconstructed wafer 230A may then undergo any additional desired wafer-level processing. It may be advantageous to attach the active surface 221 of the reconstructed wafer 230A to a length of adhesive-coated polymer 132 to protect the active surfaces 221 of the dice 220A, 220B, 220C, as depicted in FIG. 17. This procedure may occur during processing, or prior to removal of the sacrificial material. Processing of the wafer at this stage may include wafer testing and burn-in of the dice 220A, 220B, 220C, using conductive bumps 244 as contacts.

The underfill material 126 may then be removed from the reconstructed wafer to substantially fully expose the conductive bumps 244. This may be accomplished in any suitable manner, such as by selectively removing the underfill material 126 through a chemical etch process, or by selecting an underfill material that can be induced to reflow from the reconstructed wafer 230A under appropriate conditions. Removal of the underfill material results in dice 220A, 220B, 220C, with substantially fully exposed bumps 244, similar to those depicted in FIG. 18. Of course, it will be appreciated that some embodiments in which the underfill material is not removed may be utilized and are within the scope of the present invention.

The individual dice 220A, 220B, 220C, may be singulated from the reconstructed wafer 230A. Where the underfill material 126 has been removed, similar to the embodiment depicted in FIG. 18, this may be accomplished by removing the dice 220A, 220B, 220C, from the adhesive-coated polymer 132, as has been discussed previously herein. Alternatively, singulation of the reconstructed wafer 230 may be accomplished using wafer sawing techniques. Where adhesive-coated polymer 132 has been applied to the active surface 221 of the reconstructed wafer 230A, this leaves a protective layer on the active surfaces 221 of the resulting dice 220A, 220B, 220C. Alternatively, singulation may not be effected and the dice 220A, 220B, 220C, may be marketed or used as multidie assemblies. Of course, an adhesive-coated polymer 132 that is susceptible to chemical etching or other non-mechanical severance or removal may be used and such singulation is also within the scope of the present invention.

Using the processes, equipment and methods in accordance with the present invention, reconstructed wafers 230 and 230A can be created that may include only known good dice. These reconstructed wafers may then be processed in the same manner as any other wafer, using standard wafer-level processing equipment.

It will be apparent that details of the apparatus and methods herein described can be varied considerably without departing from the concept and scope of the invention. The claims alone define the scope of the invention as conceived and as described herein.

What is claimed is:

1. A reconstructed semiconductor wafer comprising:
   a plurality of laterally spaced semiconductor dice, each semiconductor die having at least a first alignment via disposed in a lower surface thereof;
   a plurality of alignment droplets disposed adjacent the lower surfaces of the plurality of semiconductor dice, each of the at least a first alignment via in contact with a solidified alignment droplet; and
   an underfill material disposed adjacent the lower surfaces of the plurality of semiconductor dice and around the plurality of alignment droplets.

2. The reconstructed semiconductor wafer of claim 1, further comprising a fixture plate adjacent the plurality of alignment droplets, such that the underfill material is disposed between the lower surfaces of the plurality of semiconductor dice and the fixture plate.

3. The reconstructed semiconductor wafer of claim 1, wherein the at least a first alignment via extends from the non-active surface of each semiconductor die to an active surface thereof.

4. The reconstructed wafer of claim 3, wherein the at least a first alignment via is filled with a material comprising the plurality of alignment droplets.

5. The reconstructed wafer of claim 3, wherein the at least a first alignment via is at least partially filled by a selected filler material.

6. The reconstructed wafer of claim 1, wherein the plurality of alignment droplets comprises a conductive material.

* * * * *